United States Patent
Borden et al.

(10) Patent No.: US 7,547,570 B2
(45) Date of Patent: Jun. 16, 2009

(54) METHOD FOR FORMING THIN FILM PHOTOVOLTAIC INTERCONNECTS USING SELF-ALIGNED PROCESS

(75) Inventors: Peter Borden, San Mateo, CA (US); David Eaglesham, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 90 days.

(21) Appl. No.: 11/394,721

(22) Filed: Mar. 31, 2006

(65) Prior Publication Data

US 2007/0232057 A1   Oct. 4, 2007

(51) Int. Cl.
    *H01L 21/00* (2006.01)
(52) U.S. Cl. .......................... 438/57; 216/18
(58) Field of Classification Search .......... 216/18; 257/E21.023, E21.026, E21.027, E21.036; 438/57

See application file for complete search history.

(56) References Cited

U.S. PATENT DOCUMENTS

| | | | |
|---|---|---|---|
| 4,000,502 A | 12/1976 | Butler et al. | |
| 4,278,473 A * | 7/1981 | Borden | 136/249 |
| 4,388,346 A | 6/1983 | Bickler | |
| 4,411,732 A | 10/1983 | Wotherspoon | |
| 4,416,052 A | 11/1983 | Stern | |
| 4,909,863 A | 3/1990 | Birkmire et al. | |
| 5,567,975 A | 10/1996 | Walsh et al. | |
| 5,581,346 A | 12/1996 | Sopori | |
| 6,300,593 B1 | 10/2001 | Powell | |
| 6,559,411 B2 | 5/2003 | Borgeson et al. | |
| 6,919,530 B2 | 7/2005 | Borgeson et al. | |
| 7,022,556 B1 * | 4/2006 | Adachi | 438/149 |

\* cited by examiner

*Primary Examiner*—N Drew Richards
*Assistant Examiner*—Grant S Withers
(74) *Attorney, Agent, or Firm*—Pillsbury Winthrop Shaw Pittman, LLP

(57) ABSTRACT

Processing steps that are useful for forming interconnects in a photovoltaic module are described herein. According to one aspect, a method according to the invention includes processing steps that are similar to those performed in conventional integrated circuit fabrication. For example, the method can include etches to form a conductive step adjacent to the grooves that can be used to form interconnects between cells. According to another aspect the method for forming the conductive step can be self-aligned, such as by positioning a mirror above the module and exposing photoresist from underneath the substrate at an angle one or more times, and etching to expose the conductive step.

9 Claims, 2 Drawing Sheets

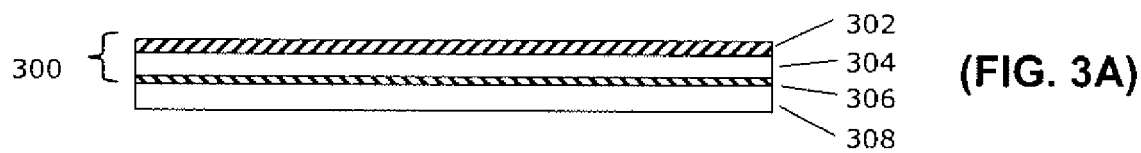
(FIG. 3A)
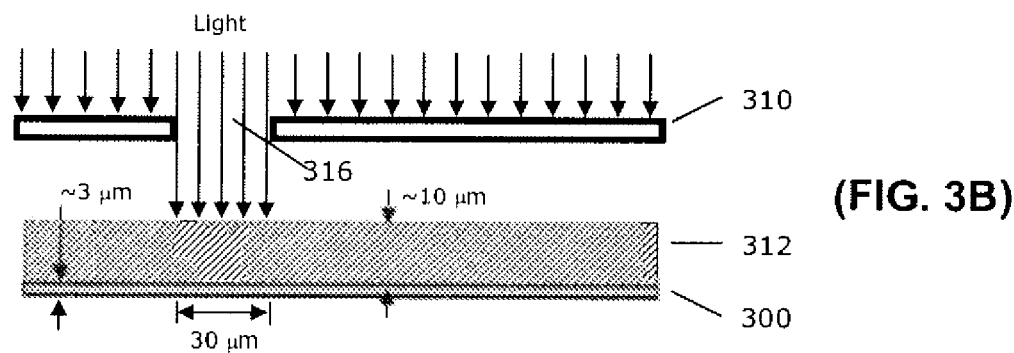
(FIG. 3B)
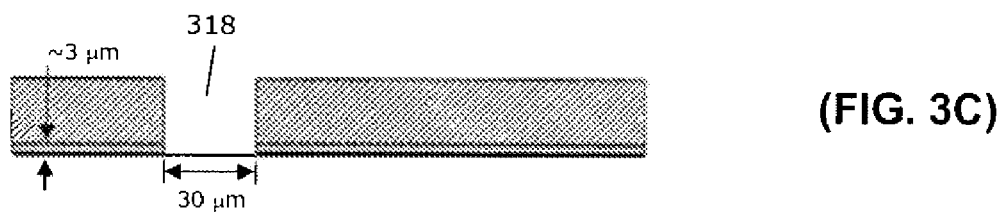
(FIG. 3C)
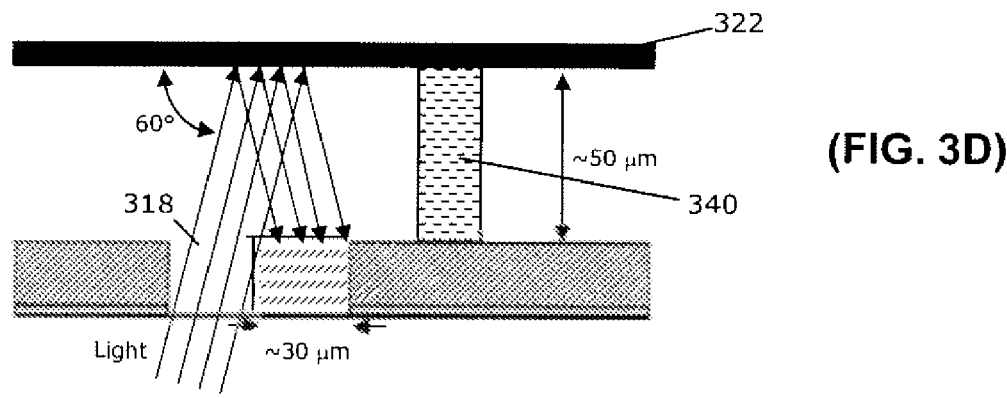
(FIG. 3D)
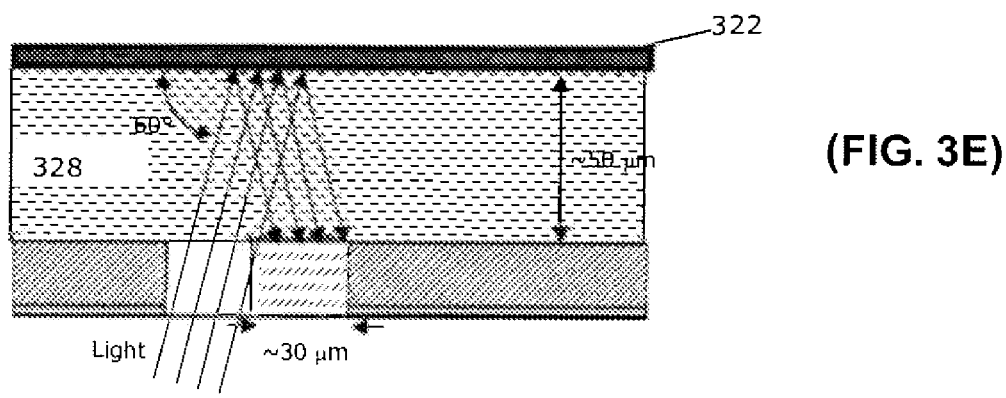
(FIG. 3E)

US 7,547,570 B2

METHOD FOR FORMING THIN FILM PHOTOVOLTAIC INTERCONNECTS USING SELF-ALIGNED PROCESS

FIELD OF THE INVENTION

The present invention relates generally to photovoltaic devices, and more particularly to a system and method for making improved interconnects in thin-film photovoltaic devices.

BACKGROUND OF THE INVENTION

Thin film solar modules offer an attractive way to achieve low manufacturing cost with reasonable efficiency. These modules are made from a variety of materials, including amorphous silicon, amorphous silicon germanium, copper indium gallium selenide (CIGS), and cadmium telluride. A common feature of these solar modules is the deposition on a large area insulator such as a glass sheet.

Another common feature of these modules is the use of scribes and interconnects to divide the large area deposited layer into a number of cells and/or sub-cells. A top view of a typical module divided in this fashion is shown in FIG. 1. As shown in FIG. 1, a module 100 is divided into a plurality of cells 102 (i.e. stripes) that are series connected (e.g. electrically connected together in a horizontal direction in this drawing) via interconnects 104. The interconnects are typically formed in the module using scribes and conductors. However, it should be noted here that the length L of such modules 100 can be 1 meter or more. Meanwhile, the width of the interconnects (corresponding to the dimension W in FIG. 2), which typically run almost the entire length L of the module, are typically around 700-1000 µm, and the width of the cells (i.e. stripes) are typically about 1 cm. As will be understood by those of skill in the art, FIG. 1 is a simplified, not-to-scale drawing of a typical module, and that the module can further include other passive and active components not shown in FIG. 1 such as electrodes, protect diodes and terminals. Moreover, the module will typically also include external contacts and/or be environmentally encapsulated.

As is known, interconnects 104 are made to provide a high voltage, low current output that is less susceptible to series resistance losses. For example, a 1 m² panel at 12% efficiency would provide 120 watts of power. If the cell operating voltage is 0.6 volts, then the current is 200 amps. Since the ohmic loss is $I^2R$ (where I is the current and R the resistance), and since the thin conductive films have relatively high resistance, most of the power would be dissipated. However, if the module was divided into 300 stripes, for example, then the voltage would be 180 volts and the current 0.56 amps. The ohmic losses would be reduced by a factor of 89,000.

Co-pending application Ser. No. 11/245,620, commonly owned by the present assignee, the contents of which are incorporated herein by reference, dramatically advanced the state of the art of forming interconnects for thin-film photovoltaic modules. One aspect of that invention included the use of a single laser scribe to form a cut that included a step structure to expose the base electrode. Another aspect of that invention was that the resulting interconnects could be much narrower than conventional interconnects, leading to more efficient module structures.

A process described in the co-pending application is shown in FIGS. 2A to 2E with reference to a portion of one interconnect region such as 106 in FIG. 1. In the first step shown in FIG. 2A, the entire conductor, semiconductor and contact stack 202-206 is deposited on the substrate 208, such as glass. In one embodiment, layer 202 is a metal such as molybdenum or a TCO such as ZnO, layer 204 is a semiconductor such as CIGS, and layer 206 is a TCO such as ZnO. In some embodiments, the entire stack is about 2-3 µm thick.

In the next step shown in FIG. 2B, a scribe 210 is made to the bottom conductor 202. As shown in FIG. 2C, a second scribe 212 is made using a smaller cut to create an exposed conductive ledge 214. Both of these scribes 210 and 212 may be made using a laser or mechanical scribe, or a combination of both.

In one embodiment where the scribes are made at the same time, a laser beam is used that has a skewed intensity profile, in that it is more intense on the left side than the right (with respect to the orientation of the drawing). This causes the left side to cut deeper than the right, forming the ledge 214. In another embodiment, two laser sources are coupled into a single fiber. One is an infrared source such as Nd:YAG with a wavelength of 1064 nm, for example, that penetrates the stack because its photon energy is below the bandgap of the semiconductor. This preferentially cuts through the conductor 202. The second is a shorter wavelength source, for example doubled Nd:YAG and 532 nm that cuts through the semiconductor 204 (e.g. CIGS) but not conductor 202. The width of the second cut is on the order of 20 to 50 µm, and the total width W can be reduced to as low as 0.01 to 0.2 cm, much narrower than was previously possible.

As shown in FIG. 2D, following the scribes, an insulator 216 is deposited on one wall. In a preferred embodiment, the insulator 216 is deposited using the following self-alignment method. A photosensitive polymer such as a polyimide or photoresist is applied over the entire module using any of a number of well-known methods, such an ink-jet, a spray or roller. The polymer is exposed from the back side through the glass. This performs a self-aligned exposure within the groove (i.e. the conductor layer 202 blocks exposure of all the photoresist except the portion in the groove). Next the polymer is developed, leaving only a coating on the left wall (with respect to the orientation shown in the drawing) that was exposed through the groove.

Finally, as shown in FIG. 2E, a conductor 218 is deposited over the insulator 216 to connect the top of the left cell 220 to the bottom of right cell 222. This provides a series connection between the cells 220 and 222. The entire length of the cut (e.g. the length L of the cut in the module as shown in FIG. 1) can then be coated with insulator and conductor materials to form the interconnects.

While the method of the co-pending application provides acceptable results and much narrower interconnects than previously possible, it may suffer from certain drawbacks. For example, laser ablation as used in the steps discussed in connection with FIGS. 2B and 2C has poor selectivity, so there can exist a narrow process window in which the ablation stops at the underlying conductor on the right side while cutting through to glass on the left. Moreover, laser ablation can cause damage at the edge, especially when performed at high ablation rates.

These drawbacks are especially apparent in connection with the laser cuts that form the conductive step. Therefore, it would be desirable to overcome many of these shortcomings, particularly in connection with forming the conductive step, while not adding extra process complexity such as alignment requirements. The present invention aims at doing this, among other things.

SUMMARY OF THE INVENTION

The present invention provides a method of forming interconnects in a photovoltaic module. According to one aspect, a method according to the invention includes processing steps that are similar to those performed in conventional integrated circuit fabrication. For example, the method can include etches to form a conductive step adjacent to the grooves that can be used to form interconnects between cells. According to another aspect the method for forming the conductive step can be self-aligned, such as by positioning a mirror above the module and exposing photoresist from underneath the substrate at an angle one or more times, and etching to expose the conductive step.

In furtherance of these and other aspects, a method for forming an interconnect in a thin film photovoltaic module includes preparing a stack of photovoltaic module layers on a top surface of a substrate, forming an isolation groove having first and second substantially parallel edges completely through the stack, while leaving photoresist on top of the stack adjacent the first and second edges of the groove, exposing the photoresist adjacent to the first edge using a process that is self-aligned to the isolation groove, and etching through one or more layers of the stack via the exposed photoresist to form a contact step adjacent the first edge of the groove. In additional furtherance of these and other aspects, the self-aligned process used in the method includes placing a reflector above the stack, and illuminating the substrate from underneath and through the groove at an angle, thereby reflecting light off the reflector and exposing the photoresist.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 3A-E show a process of forming a conductive step useful in an interconnect between thin film photovoltaic cells according to one preferred embodiment of the invention.

DESCRIPTION OF REFERENCE NUMERALS ON THE DRAWINGS

Figure 1:
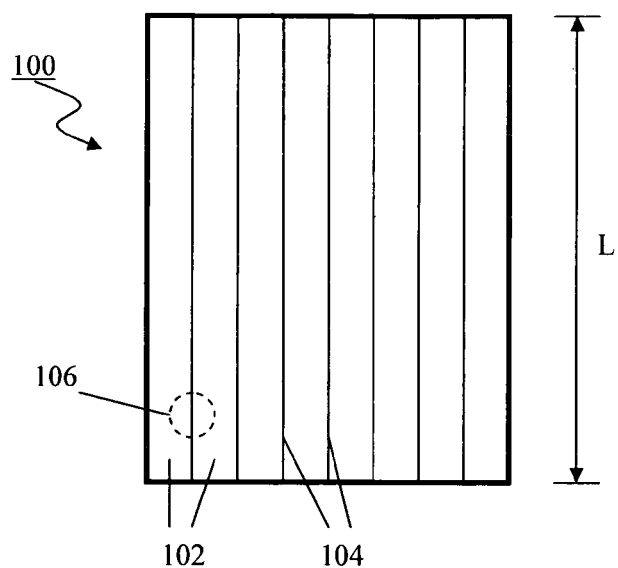
FIG. 1 is a top view of a conventional module of thin film photovoltaic cells separated by interconnects.
Figure 2:
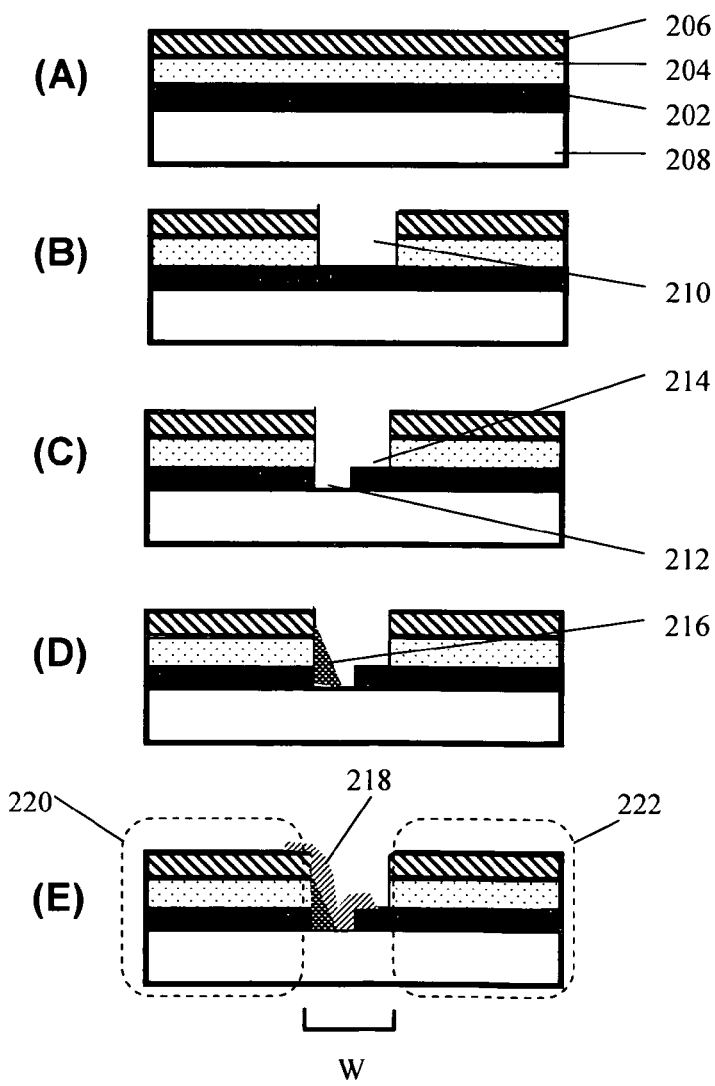
FIGS. 2A-E show a process of forming an interconnect between thin film photovoltaic cells according to a co-pending application.

The following describes the reference numerals used in the drawings. This description is intended to be illustrative rather than limiting and those skilled in the art will appreciate that various substitutions and modifications can be made while remaining within the scope of the invention:

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

In general the present invention relates to methods of forming interconnects in thin-film photovoltaic devices that use processes similar to conventional IC fabrication processes. Such processes leverage certain self-alignment and scalability advantages inherent in using IC fabrication techniques.

An example embodiment of a process flow for the formation of a contact step useful for forming interconnects between cells in a thin film photovoltaic module according to the invention is shown in FIGS. 3A-3E. It should be noted that the figures are not to scale, and that the relative dimensions of different layers and elements shown in certain process steps are exaggerated or diminished for clarifying certain aspects of the invention. Although example dimensions of various layers and features will be specified in the descriptions where appropriate, the figures are intended for illumination rather than limitation.

As shown in FIG. 3A, the process flow in this embodiment begins with a full stack 300 of starting material on a substrate 308 such as a 3 mm thick sheet of glass. In this embodiment; stack 300 includes a 0.1 µm layer 306 corresponding to the opaque metal electrode—typically molybdenum—in contact with the glass substrate 308, and a 1 µm layer 302 corresponding to the transparent electrode—typically aluminum doped ZnO—on the top surface. The process can also be used with other types of thin film modules, such as α:Si, µC:Si, and micromorph, in which case the transparent electrode may be in contact with the glass and the metal counter-electrode is on the top. For this process flow, the semiconducting layer 304 is a 2 µm layer of CIGS under a 0.07 µm buffer layer of CdS, but any other appropriate material including CIS, α:Si, µC:Si, CdTe, or stacks of multiple materials, could also be used.

It should be noted that an additional layer of material such as $SiO_2$ can be added to the top of the stack to protect the ZnO. Other protection layer materials are possible, such as BARC or BCB.

The first step in the process flow is to make an isolation cut to the glass. In a preferred embodiment, this is done with an etch process rather than laser or mechanical scribes, as will be described in more detail herein. For example, in this embodiment shown in FIG. 3B, a layer 312 of photoresist is applied to the module, using a spray, dip or roll-on process. The thickness may be 1-10 µm. 30 µm wide lines are exposed in the photoresist using a mask 310 with a corresponding aperture 316 suspended about 10 µm above (shown) or in contact with the substrate.

In FIG. 3C, the resist is developed and isolation cuts 318 are etched to the glass using either a wet or dry etch. In one example of a staged wet etch process, a HCl or $CH_3COOH$ solution can be used to etch through the ZnO layer, then a $H_2SO_4 + HNO_3$ process can be used to etch through the CIGS layer, then a $H_3PO_4 + CH_3COOH + HNO_3$ (commonly called PAN etch) process can be used to etch through the Mo layer. It should be noted that the CIGS layer etch process is unique and novel in and of itself, and various example methods of performing this or alternative CIGS etch processes are described in more detail in co-pending application Ser. No. 11/395,080, the contents of which are incorporated herein by reference. Moreover, an aspect of this invention as will be explained in more detail below, is that isolation cut 318 acts as an aperture of a mask for subsequent self-aligned processing.

Although an etch process is preferred for forming the isolation cut 318, alternative embodiments may use a mechanical or laser scribe process.

FIG. 3D illustrates a next step which begins a process of forming a conductive step or contact step in accordance with an aspect of the invention. A reflector or mirror 322 is placed in close proximity to the top surface (e.g. 50 μm) and the illumination is incident from the under side of the glass substrate 308 at an angle. As shown, the light reflects from the mirror and exposes a region of photoresist adjacent to the already formed scribe 318. Therefore, this exposure is self-aligned to the existing scribe. The width x of the step is given by the formula $$x = d \tan(\theta_S)$$

where d is the space between the substrate and the mirror, and $\theta_S$, the angle in the space between the substrate and the mirror (in the example shown FIG. 3D, $\theta_S$ is 30°=90°−60°), is given by $$\sin(\theta_S) = \frac{\sin(\theta_{IN})}{n_S}$$

where $\theta_{IN}$ is the angle of incidence of the light to the underside of the glass substrate and $n_S$ is the index of refraction of the region between the substrate and the mirror.

These formulae arise because the incident light is first refracted when it enters the glass substrate 308, and again when it passes from the glass to the space between the glass and the mirror. For example, if the angle of incidence is $\theta_{IN}$=45° and the region d between the substrate and mirror is 50 μm (i.e. 2 mils) thick and has an index of refraction of 1.3, then the step width is x=32 μm.

It is preferable to hold the spacing between the mirror and the substrate constant. In one embodiment, the mirror has soft spacers 340 that provide a fixed distance spacing without damaging the substrate. In another embodiment shown in FIG. 3E, a transparent film 328 is spread over the surface of the substrate, so that the exposure light reflects from a top surface of the film. For example, the film 328 can be clear mylar and the top surface can have a reflective coating 322 comprising aluminum, for example, to enhance reflection from the top surface. In another alternative, clear mylar film 328 without a reflective coating can be used to establish a uniform spacer for a separate reflector or mirror 322 placed thereon.

Following exposure and development, an etch is performed to form the conductive step 324. This may be done with either a dry etch or wet etch, or a combination of both. As in the previous etch processes to form groove 318, the etch chemistry may be changed to selectively progress through each layer of the cell stack, and the etch of the CIGS layer can be performed using techniques more fully disclosed in co-pending application Ser. No. 11/395,080. In some embodiments, the etch is stopped when the bottom conductor is reached (molybdenum in the case of CIGS or ZnO in the case of α:Si or μC:Si). In other cases, the etch may be stopped in the semiconductor layer. For example, in α:Si or μC:Si the semiconductor is heavily doped near the bottom, and contact to this heavily doped region is acceptable.

Additional processing can now be performed to form the interconnect between cells, as well as any insulation layers or contact layers. Although many conventional methods could be used, it is preferred to use additional techniques as disclosed in co-pending application Ser. No. 11/394,723.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A method for forming an interconnect in a thin film photovoltaic module comprising:
    preparing a stack of photovoltaic module layers on a top surface of a substrate;
    forming an isolation groove having first and second substantially parallel edges completely through the stack, while leaving photoresist on top of the stack adjacent the first and second edges of the groove;
    exposing the photoresist adjacent to the first edge using a process that is self-aligned to the isolation groove; and
    etching through one or more layers of the stack via the exposed photoresist to form a contact step adjacent the first edge of the groove.

2. A method according to claim 1, wherein the self-aligned process includes:
    placing a reflector above the stack; and
    illuminating the substrate from underneath and through the groove at an angle, thereby reflecting light off the reflector and exposing the photoresist.

3. A method according to claim 1, wherein the step of forming the isolation groove includes:
    applying the photoresist on top of the stack;
    exposing and developing portions of the photoresist using photolithography; and
    etching through the stack using the un-developed photoresist as a masking layer.

4. A method according to claim 2, wherein the reflector comprises a transparent plastic film.

5. A method according to claim 4, wherein the plastic film is coated to increase reflectivity of the coated surface.

6. A method according to claim 2, further comprising placing spacers between the stack and the reflector to maintain a distance between the substrate and the reflector.

7. A method according to claim 1, wherein the etching step includes a wet etch.

8. A method according to claim 1 wherein the etching step includes a dry etch.

9. A method according to claim 6, wherein the angle and distance are controlled such that the width x of the contact step can be approximated by the formula $$x = d \tan(\theta_S)$$

wherein d is the distance between the substrate and the reflector, and $\theta_S$, the angle in a space between the substrate and the reflector is given by $$\sin(\theta_S) = \sin(\theta_{IN})/n_s$$

wherein $\theta_{IN}$ is the angle of incidence of the light illuminating the substrate and $n_S$ is the index of refraction of a region between the substrate and the reflector.

* * * * *